United States Patent
Craven et al.

(10) Patent No.: US 8,188,458 B2
(45) Date of Patent: May 29, 2012

(54) NON-POLAR (AL,B,IN,GA)N QUANTUM WELL AND HETEROSTRUCTURE MATERIALS AND DEVICES

(75) Inventors: Michael D. Craven, San Jose, CA (US);
Stacia Keller, Santa Barbara, CA (US);
Steven P. DenBaars, Goleta, CA (US);
Tal Margalith, Santa Barbara, CA (US);
James S. Speck, Goleta, CA (US); Shuji Nakamura, Santa Barbara, CA (US);
Umesh K. Mishra, Montecito, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/099,834

(22) Filed: May 3, 2011

(65) Prior Publication Data

US 2011/0204329 A1     Aug. 25, 2011

Related U.S. Application Data

(60) Continuation of application No. 11/472,033, filed on Jun. 21, 2006, now Pat. No. 7,982,208, which is a division of application No. 10/413,690, filed on Apr. 15, 2003, now Pat. No. 7,091,514.

(60) Provisional application No. 60/372,909, filed on Apr. 15, 2002.

(51) Int. Cl.
*H01L 29/15* (2006.01)

(52) U.S. Cl. ...... 257/14; 257/11; 257/12; 257/E29.075; 438/41; 438/46; 438/48

(58) Field of Classification Search .......... 257/14, 257/11, 12, 19, 102, 103, E29.075; 438/41, 438/46, 48, 71, 481, 584, 590, 778, 786
See application file for complete search history.

(56) References Cited

U.S. PATENT DOCUMENTS

| | | | |
|---|---|---|---|
| 5,290,393 A | 3/1994 | Nakamura |
| 5,432,808 A | 7/1995 | Hatano et al. |
| 5,468,678 A | 11/1995 | Nakamura et al. |
| 5,725,674 A | 3/1998 | Moustakas et al. |
| 5,727,008 A | 3/1998 | Koga |
| 5,777,350 A | 7/1998 | Nakamura et al. |
| 5,784,187 A | 7/1998 | Cunningham et al. |
| 5,793,054 A | 8/1998 | Nido |

(Continued)

FOREIGN PATENT DOCUMENTS

EP     0942459     4/1998

(Continued)

OTHER PUBLICATIONS

Amano, H. et al., "Stress and Defect Control in GaN Using Low Temperature Interlayers," Jpn. J. Appl. Phys. vol. 37 (1998), pp. L 1540-L 1542.

(Continued)

*Primary Examiner* — Thinh T Nguyen
(74) *Attorney, Agent, or Firm* — Gates & Cooper LLP

(57) ABSTRACT

A method for forming non-polar (Al,B,In,Ga)N quantum well and heterostructure materials and devices. Non-polar (11$\bar{2}$0) a-plane GaN layers are grown on an r-plane (1$\bar{1}$02) sapphire substrate using MOCVD. These non-polar (11$\bar{2}$0) a-plane GaN layers comprise templates for producing non-polar (Al,B,In,Ga)N quantum well and heterostructure materials and devices.

21 Claims, 7 Drawing Sheets

U.S. PATENT DOCUMENTS

| | | |
|---|---|---|
| 5,923,950 A | 7/1999 | Ishibashi et al. |
| 6,045,626 A | 4/2000 | Yano et al. |
| 6,051,849 A | 4/2000 | Davis et al. |
| 6,064,078 A | 5/2000 | Northrup et al. |
| 6,069,021 A | 5/2000 | Terashima et al. |
| 6,072,197 A * | 6/2000 | Horino et al. .................. 257/103 |
| 6,086,673 A | 7/2000 | Molnar |
| 6,153,010 A | 11/2000 | Kiyoku et al. |
| 6,156,581 A | 12/2000 | Vaudo et al. |
| 6,177,292 B1 | 1/2001 | Hong et al. |
| 6,180,270 B1 | 1/2001 | Cole et al. |
| 6,201,262 B1 | 3/2001 | Edmond et al. |
| 6,218,280 B1 | 4/2001 | Kryliouk et al. |
| 6,259,122 B1 | 7/2001 | Ota et al. |
| 6,265,089 B1 | 7/2001 | Fatemi et al. |
| 6,268,621 B1 | 7/2001 | Emmi et al. |
| 6,271,104 B1 | 8/2001 | Razeghi et al. |
| 6,298,079 B1 | 10/2001 | Tanaka et al. |
| 6,316,785 B1 | 11/2001 | Nunoue et al. |
| 6,350,666 B2 | 2/2002 | Kryliouk |
| 6,398,867 B1 | 6/2002 | D'Evelyn et al. |
| 6,413,627 B1 | 7/2002 | Motoki et al. |
| 6,440,823 B1 | 8/2002 | Vaudo et al. |
| 6,441,391 B1 * | 8/2002 | Ohno et al. ...................... 257/11 |
| 6,515,313 B1 | 2/2003 | Ibbetson et al. |
| 6,566,218 B2 | 5/2003 | Otani et al. |
| 6,576,932 B2 * | 6/2003 | Khare et al. .................. 257/103 |
| 6,582,986 B2 | 6/2003 | Kong et al. |
| 6,586,316 B2 | 7/2003 | Tsuda et al. |
| 6,586,819 B2 * | 7/2003 | Matsuoka ...................... 257/628 |
| 6,590,336 B1 | 7/2003 | Kadota |
| 6,599,362 B2 | 7/2003 | Ashby et al. |
| 6,602,763 B2 | 8/2003 | Davis et al. |
| 6,623,560 B2 | 9/2003 | Biwa et al. |
| 6,627,552 B1 | 9/2003 | Nishio et al. |
| 6,635,901 B2 | 10/2003 | Sawaki et al. |
| 6,645,295 B1 | 11/2003 | Koike et al. |
| 6,656,615 B2 | 12/2003 | Dwilinski |
| 6,773,504 B2 | 8/2004 | Motoki et al. |
| 6,847,057 B1 | 1/2005 | Gardner et al. |
| 6,870,191 B2 | 3/2005 | Niki et al. |
| 6,873,634 B2 | 3/2005 | Onomura et al. |
| 6,882,051 B2 | 4/2005 | Majumdar et al. |
| 6,951,695 B2 | 10/2005 | Xu et al. |
| 6,958,093 B2 | 10/2005 | Vaudo et al. |
| 6,969,426 B1 | 11/2005 | Bliss et al. |
| 6,977,953 B2 | 12/2005 | Hata et al. |
| 6,996,147 B2 | 2/2006 | Majumdar et al. |
| 7,057,211 B2 | 6/2006 | Dwilinski et al. |
| 7,078,731 B2 | 7/2006 | D'Evelyn et al. |
| 7,132,730 B2 | 11/2006 | Dwilinski et al. |
| 7,170,095 B2 | 1/2007 | Vaudo et al. |
| 7,186,302 B2 | 3/2007 | Chakraborty et al. |
| 7,208,096 B2 | 4/2007 | Akkipeddi et al. |
| 7,303,632 B2 | 12/2007 | Negley |
| 7,368,015 B2 | 5/2008 | D'Evelyn et al. |
| 2001/0011935 A1 | 8/2001 | Lee et al. |
| 2001/0029086 A1 | 10/2001 | Ogawa et al. |
| 2002/0015866 A1 | 2/2002 | Hooper et al. |
| 2002/0047113 A1 | 4/2002 | Ohno et al. |
| 2002/0074552 A1 | 6/2002 | Weeks et al. |
| 2002/0098641 A1 | 7/2002 | Tsuda et al. |
| 2002/0144645 A1 | 10/2002 | Kim et al. |
| 2002/0187356 A1 | 12/2002 | Weeks et al. |
| 2003/0024475 A1 | 2/2003 | Anderson |
| 2003/0114017 A1 | 6/2003 | Wong et al. |
| 2003/0198837 A1 | 10/2003 | Craven et al. |
| 2004/0094773 A1 | 5/2004 | Kiyoku et al. |
| 2004/0108513 A1 | 6/2004 | Narukawa et al. |
| 2004/0135222 A1 | 7/2004 | Alfano et al. |
| 2004/0251471 A1 | 12/2004 | Dwilinski et al. |
| 2004/0261692 A1 | 12/2004 | Dwilinski et al. |
| 2005/0142391 A1 | 6/2005 | Dmitriev et al. |
| 2005/0161697 A1 | 7/2005 | Nakahata et al. |
| 2005/0205884 A1 | 9/2005 | Kim et al. |
| 2005/0214992 A1 | 9/2005 | Chakraborty et al. |
| 2005/0245095 A1 | 11/2005 | Haskell et al. |
| 2005/0258451 A1 | 11/2005 | Saxler et al. |
| 2006/0138431 A1 | 6/2006 | Dwilinski et al. |
| 2009/0146160 A1 | 6/2009 | Nakahara |

FOREIGN PATENT DOCUMENTS

| | | |
|---|---|---|
| EP | 1385196 | 1/2004 |
| JP | 03-003233 | 1/1991 |
| JP | 05-183189 | 7/1993 |
| JP | 09-116225 | 2/1997 |
| JP | 10-135576 | 5/1998 |
| JP | 10-312971 | 11/1998 |
| JP | 11-191657 | 7/1999 |
| JP | 11-346002 | 12/1999 |
| JP | 2001-257166 | 9/2001 |
| JP | 2001-298215 | 10/2001 |
| JP | 2001-342100 | 11/2001 |
| JP | 2002-076329 | 3/2002 |
| JP | 2002-076521 | 3/2002 |
| JP | 2002-111134 | 4/2002 |
| JP | 2003-124573 | 4/2003 |
| WO | 03/089694 | 10/2003 |
| WO | 03089694 | 10/2003 |
| WO | 2004/061909 | 7/2004 |
| WO | 2004/061969 | 7/2004 |
| WO | 2005/064643 | 7/2005 |

OTHER PUBLICATIONS

Aoki et al., "GaN single crystal growth using high-purity Na as a flux," Journal of Crystal Growth 242 (2002) 70-76.

Bernardini et al., "Spontaneous polarization and piezoelectric constants of III-V nitrides," Phys. Rev. B 56, R10024 (1997).

Bhattacharyya et al., "Comparative study of GaN/AlGaN MQWs grown homoepitaxially on (1 1 0 0) and (0001) GaN," Crystal Growth 251, 487 (2003).

Bigenwald et al., "Confined excitons in GaN-AlGaN quantum wells," Phys. Stat. Sol. (b) 216, 371 (1999).

Chakroborty et al., "Demonstration of nonpolar $m$-plane InGaN/GaN light-emitting diodes on free-standing $m$-plane GaN substrates," Japan J. Appl. Phys. 2005, vol. 44(5), pp. L173-L175.

Chakraborty et al., "Nonpolar InGaN/GaN emitters on reduced-defect lateral epitaxially overgrown a-plane GaN with drive-current-independent electroluminescence emission peak", Applied Physics Letters, vol. 85 No. 22, (Nov. 29, 2004).

Chen et al., "A new selective area lateral epitaxy approach for depositing $a$-plane GaN over $r$-plane sapphire", Japan J. Appl. Phys. 2003, vol. 42 (part. 2, No. 7B), pp. L818-L820.

Chitnis et al., "Visible light-emitting diodes using a-plane GaN-InGaN multiple quantum wells over r-plane sapphire", Applied Physics Letters, vol. 84 No. 18 (May 3, 2004).

Dwilinski et al., "AMMONO method of BN, AlN and GaN synthesis and crystal growth," MRS Internet J. Nitride Semicond. Res. 3, 25 (1998) 1348-1350.

Dwilinski et al., "AMMONO method of GaN and AlN production," Diamond and Related Materials 7 (1998) 1348-1350.

Funato et al., "Blue, green and amber InGaN/GaN light-emitting diodes on semipolar {11-22} GaN bulk substrates," Jap. Journal Appl. Phys., vol. 45, No. 26 (2006), pp. L659-L662 (abstract only).

Gardner et al., "Polarization anisotropy in the electroluminescence of m-plane InGaN-GaN multiple-quantum-well light-emitting diodes," Applied Physics Letters 86, 111101 (2005).

Gehrke et al., "Pendeo-epitaxy of gallium nitride and aluminum nitride films and heterostructure on silicon carbide substrate," MRS Internet J. Semicond. Res. 4S1, G3.2, 1999, 6 pp.

Ghandhi, "VLSI fabrication principles: silicon and gallium arsenide," $2^{nd}$ Edition, Wiley-Interscience, 1994, pp. 639-642.

Grandjean et al., "Self-limitation of AlGaN/GaN quantum well energy by built-in polarization field," Applied Physics Letters, vol. 74, No. 16 (Apr. 19, 1999).

Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.

Hashimoto et al., "Ammonothermal growth of GaN on an over-1-inch seed crystal," Japanese Journal of Applied Physics, vol. 44, No. 52, 2005, pp. L1570-L1572.

Haskell et al., "Defect reduction in (1120) a-plane gallium nitride via lateral epitaxial overgrowth by hydride vapor-phase epitaxy," Applied Physics Letters, vol. 83 No. 4 (Jul. 28, 2003).
Inoue et al., "Pressure-controlled solution growth of bulk GaN crystals under high pressure," Phys. Stat. Sol. (b) 223, 15 (2001) 15-27.
Iwahashi et al., "Effects of ammonia gas on threshold pressure and seed growth for bulk GaN single crystals by Na flux method," Journal of Crystal Growth 253 (2003) 1-5.
Iwaya et al., "Reduction of etch pit density in organometallic vapor phase epitaxy-grown GaN on sapphire by insertion of a low-temperature-deposited buffer layer between high-temperature-grown GaN," Jpn. J. Appl. Phys., 1998, 37: L316-L318.
Keller et al., "Metalorganic Chemical Vapor Deposition Growth of High Optical Quality and High Mobility GaN", J. Electronic Materials, vol. 24, pp. 1707-1709 (1995).
Keller et al., "Spiral growth of InGaN nanoscale islands on GaN," Jpn. J. Appl. Phys., 1998, 37: L431-L434.
Ketchum et al., "Crystal growth of gallium nitride in supercritical ammonia," Journal of Crystal Growth 222 (2001) 431-434.
Kinoshita et al., "Emission enhancement of GaN/AlGaN single-quantum-wells due to screening of piezoelectric field," MRS Internet J. Nitride Semicond. Res. 5, W11.32 (2000).
Kozodoy et al., "Electrical characterization of GaN $p$-$n$ junctions with and without threading dislocations," Appl. Phys. Lett., 1998, 73(7): 975-977.
Kuokstis et al., "Polarization effects in photoluminescence of C- and M-plane GaN/AlGaN multiple quantum wells," Appl. Phys. Lett. 81, 4130 (2002).
"Kyma Technologies announces improved and expanded native gallium nitride product line," Mar. 20, 2006, Company News Releases, retrieved from http://www.compoundsemi.com/documents/articles/cldoc/6524.html.
Langer et al., "Giant electric fields in unstrained GaN single quantum wells," Appl. Phys. Lett. 74, 3827 (1999).
Leroux et al., "Quantum confined Stark effect due to built-in internal polarization fields in (Al,Ga)N/GaN quantum wells," Phys. Rev. B 58, R113371 (1998).
McMahan, "Dr. Shuji Nakamura and UCSB research team report first nonpolar and semi-polar GaN LEDs," Compoundsemi Online, Mar. 24, 2006, one page.
Miller et al., "Electric field dependence of optical absorption near the band gap of quantum-well structures," The American Physical Society, Physical Review B, vol. 32, No. 2 (Jul. 15, 1985).
Moe et al., "Milliwatt power deep ultraviolet light emitting diodes grown on silicon carbide," Japan J. Appl. Phys. 2005, vol. 44(17), pp. L502-L504.
Monemar et al., "Properties of Zn-doped VPE-grown GaN.I.Luminescence data in relation to doping conditions," J. Appl. Phys. 51 (1), Jan. 1980, pp. 625-639.
Mukai et al., "Ultraviolet InGaN and GaN single-quantum-well-structure light-emitting diodes grown on epitaxially laterally overgrown GaN substrates," Jpn. J. Appl. Phys., vol. 38, pp. 5735-5739 (1999).
Nakamura et al., The Blue Laser Diode, (Springer, Heidelberg, 1997), pp. 160-178.
Nakamura et al., "InGaN/GaN/AlGaN-based laser diodes with modulation-doped strained-layer superlattices grown on an epitaxially laterally overgrown GaN substrate," Appl. Phys. Lett., 1998, 72(2): 211-213.
Neubert, "Growth characteristics of GaInN quantum wells on semipolar GaN facets," Annual Report 2005, Optoelectronics Department, University of Ulm 2006, pp. 1-6.
Ohba et al., "A study on strong memory effects for Mg doping in GaN metalorganic chemical vapor deposition," J. Cryst. Growth, vol. 145, 1994, pp. 214-218.
Ok-Hyun et al., "Violet InGaN/GaN/AlGaN-based laser diodes operable at 50 C with a fundamental transverse mode," Jpn. J. Appl. Phys., vol. 38, No. 3A, 1999, pp. L226-229, Part 2.
Parish et al., "High-performance (Al,Ga) N-based solar-blind ultraviolet $p$-$i$-$n$ detectors on laterally epitaxially overgrown GaN," Appl. Phys. Lett., 1999, 75(2): 247-249.

Pearton et al., "GaN: Processing, defects, and devices," Applied Physics Reviews, Journal of Applied Physics, vol. 86, No. 1 (Jul. 1, 1999).
Peters, "Ammonothermal synthesis of aluminium nitride," Journal of Crystal Growth 104 (1990) 411-418.
Porowski, "Near defect free GaN substrates," MRS Internet Journal of Nitride Semiconductor, Res. 4S1 (1999) G1.3, 11 pages.
Sharma et al., "Demonstration of a semipolar (1013) InGaN/GaN green light emitting diode," Applied Physics Letters 87, 231110 (2005), pp. 1-3.
Srikant et al., "Mosaic structure in epitaxial thin films having large lattice mismatch," J. Appl. Phys., 1997, 82(9): 4286-4295.
Sun et al., "In surface segregation in M-plane (In,Ga)N/GaN multiple quantum well structures," Applied Physics Letters, vol. 83 No. 25 (Dec. 22, 2003).
Sun et al., "Nonpolar $In_xGa_{1-x}N$/GaN(1100) multiple quantum wells grown on $\gamma$-$LiAlO_2$(100) by plasma-assisted molecular-beam epitaxy," Physical Review B 67 (2003).
Takeuchi et al., "Theoretical study of orientation dependence of piezoelectric effects in wurtzite strained GaInN/GaN heterostructures and quantum wells," Jpn. J. Appl. Phys. vol. 39, pp. 413-416, Part 1, No. 2A (Feb. 2000).
Tanaka et al., "Anti-surfactant in III-nitride-epitaxy—quantum dot formation and dislocation termination," Jpn. J. Appl. Phys., 2000, 39: L831-L834.
Tanaka et al., "Self-assembling GaN quantum dots on $Al_xGa_{1-x}N$ surfaces using a surfactant," Appl. Phys. Lett., 1996, 69(26): 4096-4098.
Traetta et al., "Effects of the spontaneous polarization and piezoelectric fields on the luminescence spectra of $GaN/Al_{0.15}Ga_{0.85}N$ quantum wells", Physica E 7, 929-933 (2000).
Usui et al., "Thick GaN epitaxial growth with low dislocation density by hydride vapor phase epitaxy," Jpn. J. Appl. Phys., 1997, 36: L899-L902.
Vanfleet et al., "Defects in m-face GaN films grown in halide vapor phase epitaxy on $LiAlO_2$", Applied Physics Letters, vol. 83 No. 6 (Aug. 11, 2003).
Wang et al., "Crystal tilting in the epitaxial laterally overgrown GaN films on sapphire substrate by hydride vapor phase epitaxy," Solid State and Integrated-Circuit Technology Proceedings, $6^{th}$ International Conference, Oct. 2001, vol. 2, pp. 1998-1201.
Amano, H., et. al., "Metalorganic vapor phase epitaxial growth of a high quality GaN film using an AlN buffer layer" Appl. Phys. Lett. 48 (5), Feb. 3, 1986, pp. 353-355.
Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.
Bottcher, T., et al., "The role of high-temperature island coalescence in the development of stresses in GaN films" Appl. Phys. Lett. 78 (14), Apr. 2, 2001, pp. 1976-1978.
Brandt, O., et al., "Determination of strain state and composition of highly mismatched group-III nitride heterostructures by x-ray diffraction" J. Phys. D. Appl. Phys. 35 (2002), pp. 577-585.
Craven, M.D., et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.
Craven, M.D. et al., "Structural characterization of nonpolar (1120) a-plane GaN thin films grown on (1102) r-plane sapphire", Applied Physics Letters, vol. 81, No. 3, Jul. 15, 2002, pp. 469-471, XP002250684.
Craven, M.D., et al., "Threading dislocation reduction via laterally overgrown nonpolar (1120) a-plane GaN" Appl. Phys. Lett. 81 (7), Aug. 12, 2002, pp. 1201-1203.
Dovidenko, K., et. al., Characteristics of stacking faults in AlN thin films J. Appl. Phys. 82 (9), Nov. 1, 1997, pp. 4296-4299.
Dupuis, R.D., et al., "Selective-area and lateral epitaxial overgrowth of III-N materials by metalorganic chemical vapor deposition" J. Crystal Growh, vol. 195, No. 1-4, Dec. 15, 1998, pp. 340-345.
Eastman, L.F., "The Toughest Transistor Yet" IEEE Spectrum 39 (5), May 2002, pp. 28-33.

Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-455.

Etzkorn, E.V., et al., "Cracking of GaN films" J. Appl. Phys. 89 (2), Jan. 15, 2001, pp. 1025-1034.

Freitas, J. A., Jr., et al., "Optical characterization of lateral epitaxial overgrown GaN layers" Appl. Phys. Lett. 72 (23), Jun. 8, 1998, pp. 2990-2992.

Grandjean, N., et al., "Built-in electric-field effects in wurtzite AlGaN quantum wells" J. Appl. Phys. 86 (7), Oct. 1, 1999, pp. 3714-3720.

Grzegory, I. et al., "Seeded growth of GaN at high $N_2$ pressure on (0 0 0 1) polar surfaces of GaN single crystalline substrates", Materials Science in Semiconductor Processing, vol. 4, No. 6, Dec. 2001, pp. 535-541, XP004345737.

Heying, B., et al., "Role of threading dislocation structure on the x-ray diffraction peak widths in epitaxial GaN films" Appl. Phys. Lett. 68 (5), Jan. 29, 1996, pp. 643-645.

Im, J.S., et al., "Reduction of oscillator strength due to piezoelectric fields in GaN/$Al_xGa_{1-x}$N quantum wells" Phys. Rev. B. 57 (16), Apr. 15, 1998-II, pp. R9435-R9438.

Iwata, K., et. al., "Gas Source Molecular Beam Epitaxy Growth of GaN on C-, A-, R-, and M-Plane Sapphire and Silica Glass Substrates" Jpn. J. Appl. Phys. vol. 36 (1997), pp. L 661-L664.

Kapolnek, D., et al., "Anisotropic epitaxial lateral growth in GaN selective area epitaxy" Appl. Phys. Lett. 71 (9), Sep. 1, 1997, pp. 1204-1206.

Langer, R., et. al., "Giant electric fields in unstrained GaN single quantum wells" Appl. Phys. Lett., 74 (25), Jun. 21, 1999, pp. 3827-3829.

Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.

Lefebvre, P., et al., "Time-resolved photoluminescence as a probe of internal electric fields in GaN-(GaAl)N quantum wells" Phys. Rev. B. 59 (23), Jun. 15, 1999-I, pp. 15363-15367.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1991-I, pp. 1496-1499.

Leszczynski, M., et. al., "Lattice parameters of gallium nitride" Appl. Phys. Lett. 69 (1), Jul. 1, 1996, pp. 73-75.

Liu, L. et al., "Substrates for gallium nitride epitaxy", Materials Science and Engineering R, Reports: A Review Journal, vol. 37, No. 3, Apr. 30, 2002, pp. 61-127.

Marchand, H., et al., "Microstructure of GaN laterally overgrown by metalorganic chemical vapor deposition" Appl. Phys. Lett.. 73 (6), Aug. 10, 1998, pp. 747-749.

Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.

Marchand, H., et al., "Mechanisms of lateral epitaxial overgrowth of gallium nitride by metalorganic chemical vapor deposition" J. of Crystal Growth, vol. 195, No. 1-4, Dec. 15, 1998, pp. 328-332.

Metzger, Th., et. al., "X-Ray Diffraction Study of Gallium Nitride Grown by MOCVD" Physica status solidi (b) 193, 1996, pp. 391-397.

Mills, Alan, "Wide-bandgap emitters continue to improve", III-Vs Review, vol. 13, No. 3, May 2000, pp. 23-24, 26, 28-30, XP004200697.

B. Monemar, et. al., "Properties of Zn-doped VPE-grown GaN.I. Luminescence data in relation to doping conditions" J. Appl. Phys. 51 (1), Jan. 1980, pp. 625-639.

Moustakas, T.D., et. al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.

Maruska, H.P. et al., "Development of 50 mm Diameter Non-Polar Gallium Nitride Substrates for Device Applications", International Conference on Indium Phosphide and Related Materials, May 16, 2003, pp. 567-570.

Nakamura, S, et. al., "Violet InGaN/GaN/AlGaN-Based Laser Diodes Operable at 50° C with a Fundamental Transverse Mode" Jpn. J. Appl. Phys. 38 (2), 1999, pp. L226-L229.

Nam, O., et. al., "Lateral epitaxy of low defect density GaN layers via organometallic vapor phase epitaxy" Appl. Phys. Lett. 71 (18), Nov. 3, 1997, pp. 2638-2640.

Nataf, G., et. al., "Lateral overgrowth of high quality GaN layers on GaN/$Al_2O_3$ patterned substrates by halide vapour-phase epitaxy" J. of Crystal Growth (192), Feb. 20, 1998, pp. 73-78.

Ng, H. M., "Molecular-beam epitaxy of GaN/$Al_xGa_{1-x}$N multiple quantum wells on R-plane (1012) sapphire substrates" Appl. Phys. Lett. 80 (23), Jun. 10, 2002, pp. 4369-4371.

Nichizuka, K., "Efficient Radiative Recombination From <1122>-oriented InxGa1-xN Multiple Quantum Wells Fabricated by the Regrowth Technique," Applied Physics Letters, Oct. 2004, vol. 85, No. 15, pp. 3122-3124, abstract.

Nishida, T., et al., "Ten Milliwatt Operation of an AlGaN-Based Light Emitting Diode Grown on GaN Substrate" Phys. Stat. Sol. (a) 188 (1), 2001, pp. 113-116.

Park, S., et. al., "Spontaneous polarization effects in wurtzite GaN/AlGaN quantum wells and comparison with experiment" Appl. Phys. Lett. 76 (15), Apr. 10, 2000, pp. 1981-1983.

Park, J., et. al., "Selective-area and lateral epitaxial overgrowth of III-N materials by metal organic chemical vapor deposition" Appl. Phys. Lett. 73 (3), Jul. 20, 1998, pp. 333-335.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Rosner, S.J., et. al., "Cathodoluminescence mapping of epitaxial lateral overgrowth in gallium nitride" Appl. Phys. Lett. 74 (14), Apr. 5, 1999, pp. 2035-2037.

Sakai, A., et al., "Self-organized propagation of dislocations in GaN films during epitaxial lateral growth" Appl. Phys. Lett. 76 (4), Jan. 24, 2000, pp. 442-444.

Sasaki, T. et al, "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.

Sano, M., et al., "Epitaxial Growth of Undoped and Mg-Doped GaN" Jpn. J. of Appl. Phys. 15 (10), Oct. 1976, pp. 1943-1950.

Sharma, R., "Demonstration of a Semipolar (1013) InGaN/GaN Green Light Emitting Diode," Applied Physics Letters, Nov. 2005, vol. 87, 231110, pp. 1-3, abstract.

Shintani, A., et al. "Light Emitting Patterns of Gallium Nitride Electroluminescence" J. Electrochem. Soc. 123 (10), Oct. 1976, pp. 1575-1578.

Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Sun, Chien-Jen et al., "Comparison of the physical properties of GaN thin films deposited on (0001) and (0112) sapphire substrates", Applied Physics Letters, vol. 63, No. 7, 1993, pp. 973-975, XP002251480.

Takeuchi, T., et. al., "Determination of piezoelectric fields in strained GaInN quantum wells using the quantum-confined Stark effect" Appl. Phys. Lett. 73 (12), Sep. 21, 1998, pp. 1691-1693.

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-L385.

Tan, I-H., et. al., "A self consistent solution of Schrodinger-Poisson equations using a nonuniform mesh" J. Appl. Phys. 68 (8), Oct. 15, 1990, pp. 4071-4076.

Tsuchiya, H., et al., "Growth condition dependence of GaN crystal structure on (0 0 1)GaAs by hydride vapor-phase epitaxy" J. of Crystal Growth (189/190), 1998, pp. 395-400.

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6$^{th}$ International Conference, Oct. 2001, vol. 2, pp. 1998-1201.

Waltereit, P., et. al., "Nitride semiconductors free of electrostatic fields for efficient white light-emitting diodes" Nature vol. 406, Aug. 24, 2000, pp. 865-868.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lasing Threshold Current Density by the Lowering of Valence Band Effective Mass" J. of Lightwave Tech. vol. LT-4 (5), May 1986, pp. 504-506.

Yu., Z., et. al., "Epitaxial lateral overgrowth of GaN on SiC and sapphire substrates" MRS Internet J. Nitride Semicond. Res. 4S1, G4.3 (1999).

Zheleva, T., et. al., "Dislocation density reduction via lateral epitaxy in selectively grown GaN structures" Appl. Phys. Lett. 71 (17), Oct. 27, 1997, pp. 2472-2474.

Zheleva, T., et. al., "Pendo-epitaxy—A new approach for lateral growth of gallium nitride structures" MRS Internet J. Nitride Semicond. Res. 4S1, G3.38 (1999).

Japanese Office Action mailed Apr. 1, 2009, Application No. 2003-586403, filing dated Apr. 15, 2003.

Japanese Office Action mailed Apr. 1, 2009, Application No. 2003-586402, filing date Apr. 15, 2003.

Japanese Office Action mailed Aug. 27, 2009, Application No. 2003-586401.

Japanese Inquiry dated Jul. 1, 2011, Japanese Patent Application No. 2003-586402, with English translation.

Notice of Final Rejection, Japanese Patent Application No. 2003-586401, dated Jan. 19, 2011.

International Search Report, International application No. PCT/US03/11175, International filing date Apr. 15, 2003, mailed Aug. 26, 2003.

European Office Action dated Feb. 16, 2009, Application No. 03 719 669.5.

European Office Action dated Sep. 16, 2010, Application No. 03719699.5.

International Search Report for PCT Application No. PCT/US2007/022607 filed Oct. 25, 2007.

Decision of Rejection, Korean Patent Application No. 10-2004-7016454, dated Jan. 31, 2011.

Korean Office Action (with English translation) for application No. 2004-7016454 dated Jul. 1, 2011.

Korean Office Action (with English translation) for application No. 2011-7010086 dated Jun. 30, 2011.

Korean Office Action, KR application No. 2004-7016454 dated Apr. 22, 2010.

Chen, C. et al., "Ultraviolet light emitting diodes using non-polar a-plane GaN-AlGaN multiple quantum wells," Jpn. J. Appl. Phys., vol. 42, No. 9A/B, Sep. 15, 2003, pp. L1039-L1040.

Craven, M., et al., "Characterization of a-plane GaN/(Al,Ga)N multiple quantum wells grown via metalorganic chemical vapor deposition," Jpn. J. Appl. Phys. vol. 42, No. 3A, Mar. 1, 2003, pp. L235-L238.

Kuokstis, E. et al., "Polarization effects in photoluminescence of c- and m-plane GaN/AlGaN multiple quantum wells," Appl. Phys. Lett., vol. 81, No. 22, Nov. 25, 2002, pp. 4130-4132.

Ng, H., "Molecular-beam epitaxy of GaN/Al$_x$Ga1-xN multiple quantum wells on r-plane (1012) sapphire substrates," Appl. Phys. Lett., vol. 80, No. 23, Jun. 10, 2002, pp. 4369-4371.

Sun, W. et al., "Strong ultraviolet emission from non-polar AlGaN/GaN quantum wells grown over r-plane sapphire substrates," Phys. Stat. Sol. (a), vol. 200, No. 1, Nov. 2003, pp. 48-51.

EP Office Action dated Sep. 12, 2011, Application No. 03 790 447.1.

EP Office Action dated Aug. 23, 2011, Application No. 03 723 982.9.

\* cited by examiner

NON-POLAR (AL,B,IN,GA)N QUANTUM WELL AND HETEROSTRUCTURE MATERIALS AND DEVICES

CROSS-REFERENCE TO RELATED APPLICATIONS

This application is a continuation under 35 U.S.C. Section 120 of co-pending and commonly-assigned U.S. Utility patent application Ser. No. 11/472,033, filed on Jun. 21, 2006, by Michael D. Craven, Stacia Keller, Steven P. DenBaars, Tal Margalith, James S. Speck, Shuji Nakamura, and Umesh K. Mishra, entitled "NON-POLAR (Al,B,In,Ga)N QUANTUM WELL AND HETEROSTRUCTURE MATERIALS AND DEVICES, which application is a divisional application claiming the benefit under 35 U.S.C. Section 120 and Section 121 of U.S. Utility patent application Ser. No. 10/413,690, filed on Apr. 15, 2003, now U.S. Pat. No. 7,091,514, issued Aug. 15, 2006, by Michael D. Craven, Stacia Keller, Steven P. DenBaars, Tal Margalith, James S. Speck, Shuji Nakamura, and Umesh K. Mishra, entitled "NON-POLAR (Al,B,In,Ga)N QUANTUM WELL AND HETEROSTRUCTURE MATERIALS AND DEVICES which application claims the benefit under 35 U.S.C. §119(e) of the following co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra, all of which applications are incorporated by reference herein.

This application is related to the following co-pending and commonly-assigned United States Utility patent applications:

Ser. No. 10/413,691, entitled "NON-POLAR A-PLANE GALLIUM NITRIDE THIN FILMS GROWN BY METALORGANIC CHEMICAL VAPOR DEPOSITION," filed Apr. 15, 2003, by Michael D. Craven and James S. Speck, and Ser. No. 10/413,913, entitled "DISLOCATION REDUCTION IN NON-POLAR GALLIUM NITRIDE THIN FILMS," Apr. 15, 2003, now issued U.S. Pat. No. 6,900,070 issued May 31, 2005, by Michael D. Craven, Stacia Keller, Steven P. DenBaars, Tal Margalith, James S. Speck, Shuji Nakamura, and Umesh K. Mishra, both of which applications are incorporated by reference herein.

FIELD OF THE INVENTION

The invention is related to semiconductor materials, methods, and devices, and more particularly, to non-polar (Al,B,In,Ga)N quantum well and heterostructure materials and devices.

DESCRIPTION OF THE RELATED ART (Note: This application references a number of different patents, applications and/or publications as indicated throughout the specification by one or more reference numbers. A list of these different publications ordered according to these reference numbers can be found below in the section entitled "References." Each of these publications is incorporated by reference herein.)

Current state of the art (Al,B,In,Ga)N heterostructures and quantum well structures employ c-plane (0001) layers. The total polarization of a III-N film consists of spontaneous and piezoelectric polarization contributions, which both originate from the single polar [0001] axis of the wurtzite nitride crystal structure. Polarization discontinuities which exist at surfaces and interfaces within nitride heterostructures are associated with fixed sheet charges, which in turn produce electric fields. Since the alignment of these internal electric fields coincides with the growth direction of the c-plane (0001) layers, the fields affect the energy bands of device structures.

In quantum wells, the "tilted" energy bands spatially separate electrons and hole wave functions, which reduces the oscillator strength of radiative transitions and red-shifts the emission wavelength. These effects are manifestations of the quantum confined Stark effect (QCSE) and have been thoroughly analyzed for GaN/(Al,Ga)N quantum wells. See References 1-8. Additionally, the large polarization-induced fields are partially screened by dopants and impurities, so the emission characteristics can be difficult to engineer accurately.

The internal fields are also responsible for large mobile sheet charge densities in nitride-based transistor heterostructures. Although these large 2 D electron gases (2 DEGs) are attractive and useful for devices, the polarization-induced fields, and the 2 DEG itself, are difficult to control accurately.

Non-polar growth is a promising means of circumventing the strong polarization-induced electric fields that exist in wurtzite nitride semiconductors. Polarization-induced electric fields do not affect wurtzite nitride semiconductors grown in non-polar directions (i.e., perpendicular to the [0001] axis) due to the absence of polarization discontinuities along non-polar growth directions.

Recently, two groups have grown non-polar GaN/(Al, Ga)N multiple quantum wells (MQWs) via molecular beam epitaxy (MBE) without the presence of polarization-induced electric fields along non-polar growth directions. Waltereit et al. grew m-plane GaN/$Al_{0.1}Ga_{0.9}$N MQWs on γ-$LiAlO_2$ (100) substrates and Ng grew a-plane GaN/$Al_{0.15}Ga_{0.85}$N MQW on r-plane sapphire substrates. See References 9-10.

Despite these results, the growth of non-polar GaN orientations remains difficult to achieve in a reproducible manner.

SUMMARY OF THE INVENTION

The present invention describes a method for forming non-polar (Al,B,In,Ga)N quantum well and heterostructure materials and devices. First, non-polar (११$\bar{2}$0) a-plane GaN thin films are grown on a (1$\bar{1}$02) r-plane sapphire substrate using metalorganic chemical vapor deposition (MOCVD). These non-polar (11$\bar{2}$0) a-plane GaN thin films are templates for producing non-polar (Al,B,In,Ga)N quantum well and heterostructure materials and devices thereon.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of the present invention is to provide a method for producing non-polar (Al,B,In,Ga)N quantum well and heterostructure materials and devices, using non-polar (11$\bar{2}$0) a-plane GaN thin films as templates.

The growth of device-quality non-polar (11$\bar{2}$0) a-plane GaN thin films on (1$\bar{1}$02) r-plane sapphire substrates via MOCVD is described in co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra, as well as co-pending and commonly-assigned U.S. Utility patent application Ser. No. 10/413,691, entitled "NON-POLAR A-PLANE GALLIUM NITRIDE THIN FILMS GROWN BY METALORGANIC CHEMICAL VAPOR DEPOSITION," filed on same date herewith, by Michael D. Craven and James S. Speck, both of which applications are incorporated by reference herein.

The present invention focuses on the subsequent growth of (Al,B,In,Ga)N quantum wells and heterostructures on the (11$\bar{2}$0) a-plane GaN layers. The luminescence characteristics of these structures indicate that polarization-induced electric fields do not affect their electronic band structure, and consequently, polarization-free structures have been attained. The development of non-polar (Al,B,In,Ga)N quantum wells and heterostructures is important to the realization of high-performance (Al,B,In,Ga)N-based devices which are unaffected by polarization-induced electric fields.

Potential devices to be deposited on non-polar (11$\bar{2}$0) a-plane GaN layers include laser diodes (LDs), light emitting diodes (LEDs), resonant cavity LEDs (RC-LEDs), vertical cavity surface emitting lasers (VCSELs), high electron mobility transistors (HEMTs), heterojunction bipolar transistors (HBTs), heterojunction field effect transistors (HFETs), as well as UV and near-UV photodetectors.

Process Steps

Figure 1:
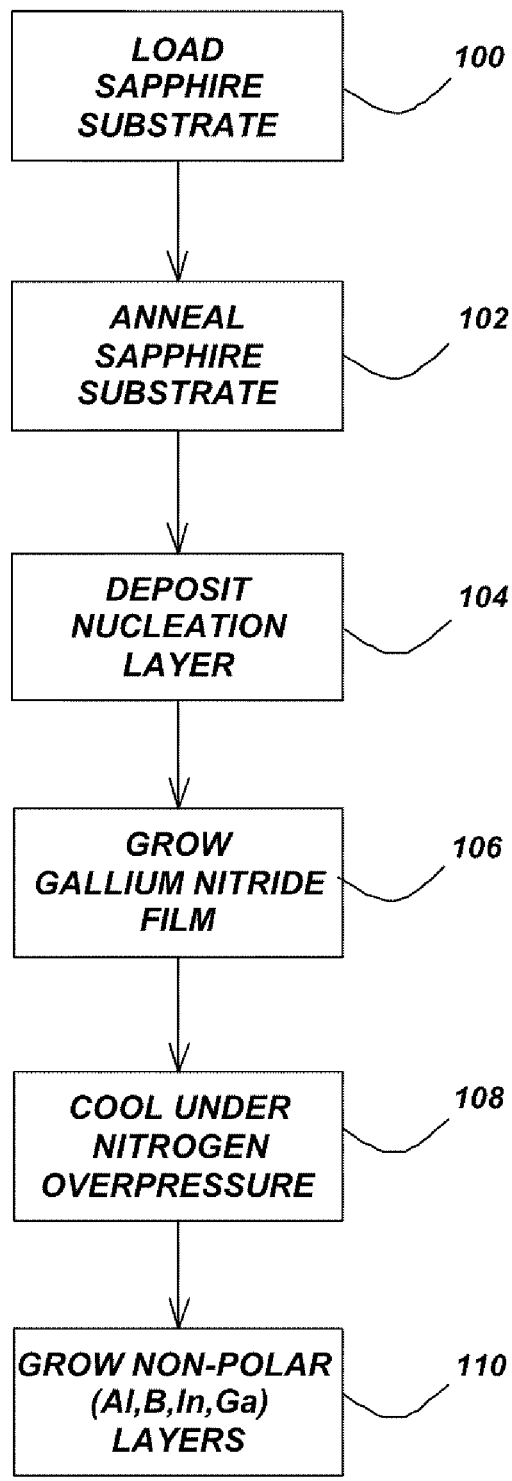
FIG. 1 is a flowchart that illustrates the steps of a method for forming non-polar (Al,B,In,Ga)N quantum well and heterostructure materials and devices according to a preferred embodiment of the present invention.

FIG. 1 is a flowchart that illustrates the steps of a method for forming non-polar (Al,B,In,Ga)N quantum well and heterostructure materials and devices according to a preferred embodiment of the present invention. The steps of this method include the growth of "template" (11$\bar{2}$0) a-plane GaN layers, followed by the growth of layers with differing alloy compositions for quantum wells and heterostructures.

Block 100 represents loading of a sapphire substrate into a vertical, close-spaced, rotating disk, MOCVD reactor. For this step, epi-ready sapphire substrates with surfaces crystallographically oriented within +/−2° of the sapphire r-plane (1$\bar{1}$20) may be obtained from commercial vendors. No ex-situ preparations need be performed prior to loading the sapphire substrate into the MOCVD reactor, although ex-situ cleaning of the sapphire substrate could be used as a precautionary measure.

Block 102 represents annealing the sapphire substrate in-situ at a high temperature (>1000° C.), which improves the quality of the substrate surface on the atomic scale. After annealing, the substrate temperature is reduced for the subsequent low temperature nucleation layer deposition.

Block 104 represents depositing a thin, low temperature, low pressure, nitride-based nucleation layer as a buffer layer on the sapphire substrate. Such layers are commonly used in the heteroepitaxial growth of c-plane (0001) nitride semiconductors. In the preferred embodiment, the nucleation layer is comprised of, but is not limited to, 1-100 nanometers (nm) of GaN deposited at approximately 400-900° C. and 1 atm.

After depositing the nucleation layer, the reactor temperature is raised to a high temperature, and Block 106 represents growing the epitaxial (11$\bar{2}$0) a-plane GaN layers to a thickness of approximately 1.5 μn. The high temperature growth conditions include, but are not limited to, approximately 1100° C. growth temperature, 0.2 atm or less growth pressure, 30 μmol per minute Ga flow, and 40,000 μmol per minute N flow, thereby providing a V/III ratio of approximately 1300). In the preferred embodiment, the precursors used as the group III and group V sources are trimethylgallium and ammonia, respectively, although alternative precursors could be used as well. In addition, growth conditions may be varied to produce different growth rates, e.g., between 5 and 9 Å per second, without departing from the scope of the present invention.

Upon completion of the high temperature growth step, Block 108 represents cooling the epitaxial (11$\bar{2}$0) a-plane GaN layers down under a nitrogen overpressure.

Finally, Block 110 represents non-polar (Al,B,In,Ga)N layers, with differing alloy compositions and hence differing electrical properties, being grown on the non-polar (11$\bar{2}$0) a-plane GaN layers. These non-polar (Al,B,In,Ga)N layers are used to produce quantum wells and heterostructures.

The quantum wells employ alternating layers of different bandgap such that "wells" are formed in the structure's energy band profile. The precise number of layers in the structure depends on the number of quantum wells desired. Upon excitation, electrons and holes accumulate in the wells of the conduction and valence bands, respectively. Band-to-band recombination occurs in the well layers since the density-of-states is highest at these locations. Thus, quantum wells can be engineered according to the desired emission characteristics and available epitaxial growth capabilities.

The nominal thickness and composition of the layers successfully grown on the non-polar (11$\bar{2}$0) a-plane GaN layers include, but are not limited to:

8 nm Si-doped $In_{0.03}$GaN barrier
1.5, 2.5, or 5 nm $In_{0.1}$GaN well

Moreover, the above Blocks may be repeated as necessary. In one example, Block 110 was repeated 5 times to form an MQW structure that was capped with GaN to maintain the integrity of the (In,Ga)N layers. In this example, the layers comprising the MQW structure were grown via MOCVD at a temperature of 825° C. and atmospheric pressure.

Figure 2:
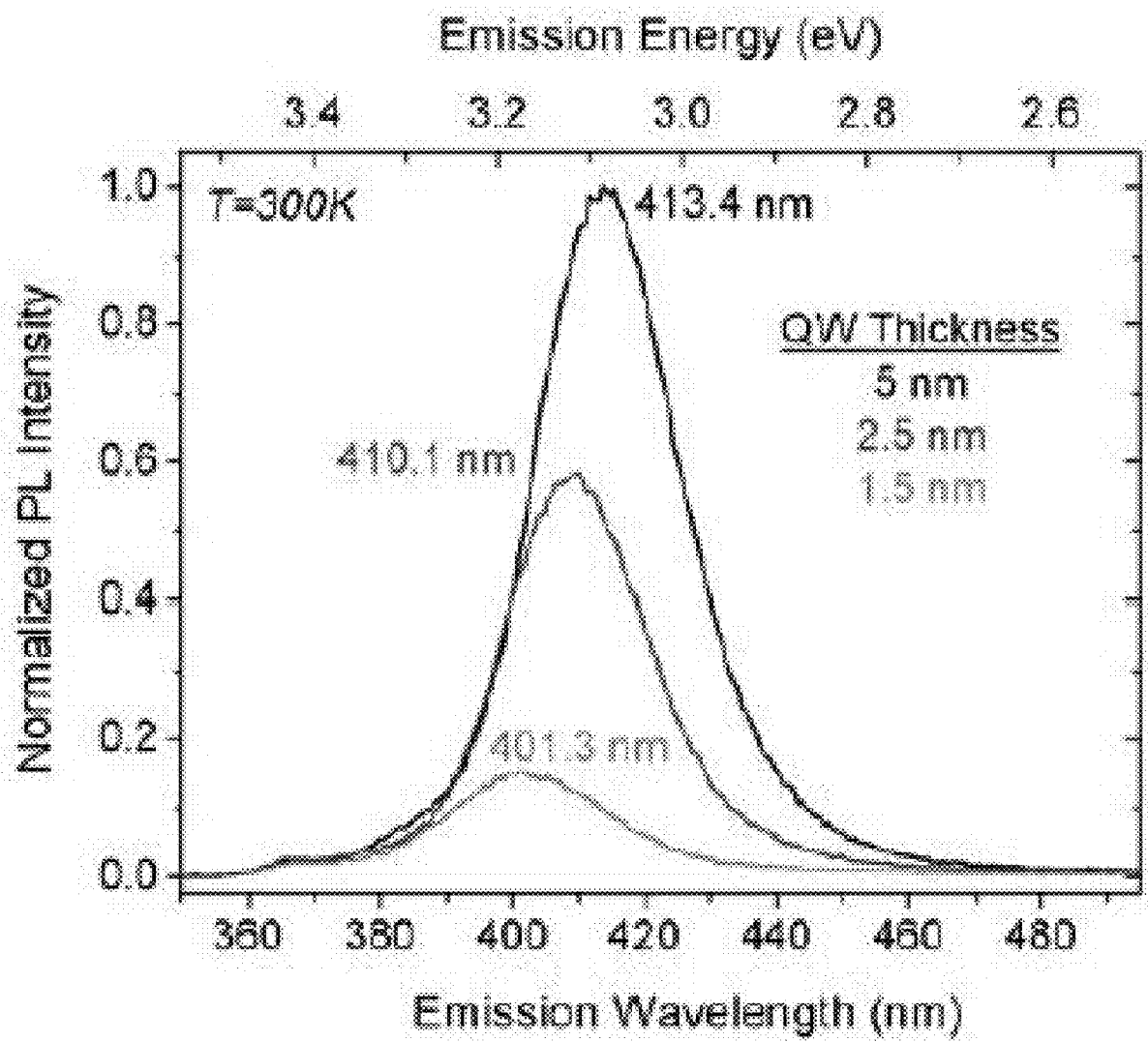
FIG. 2 illustrates the photoluminescence (PL) spectra of 5-period a-plane $In_{0.1}$GaN/$In_{0.03}$GaN MQW structures with nominal well widths of 1.5 nm, 2.5 nm, and 5.0 nm measured at room temperature.

The luminescence characteristics of this structure indicate that polarization-induced electric fields do not affect the band profiles, and the quantum wells can be considered polarization-free. For example, FIG. 2 illustrates the photoluminescence (PL) spectra of 5-period a-plane $In_{0.1}GaN/In_{0.03}GaN$ MQW structures with nominal well widths of 1.5 nm, 2.5 nm, and 5.0 nm measured at room temperature. The peak PL emission wavelength and intensity increase with increasing well width.

Figure 3:
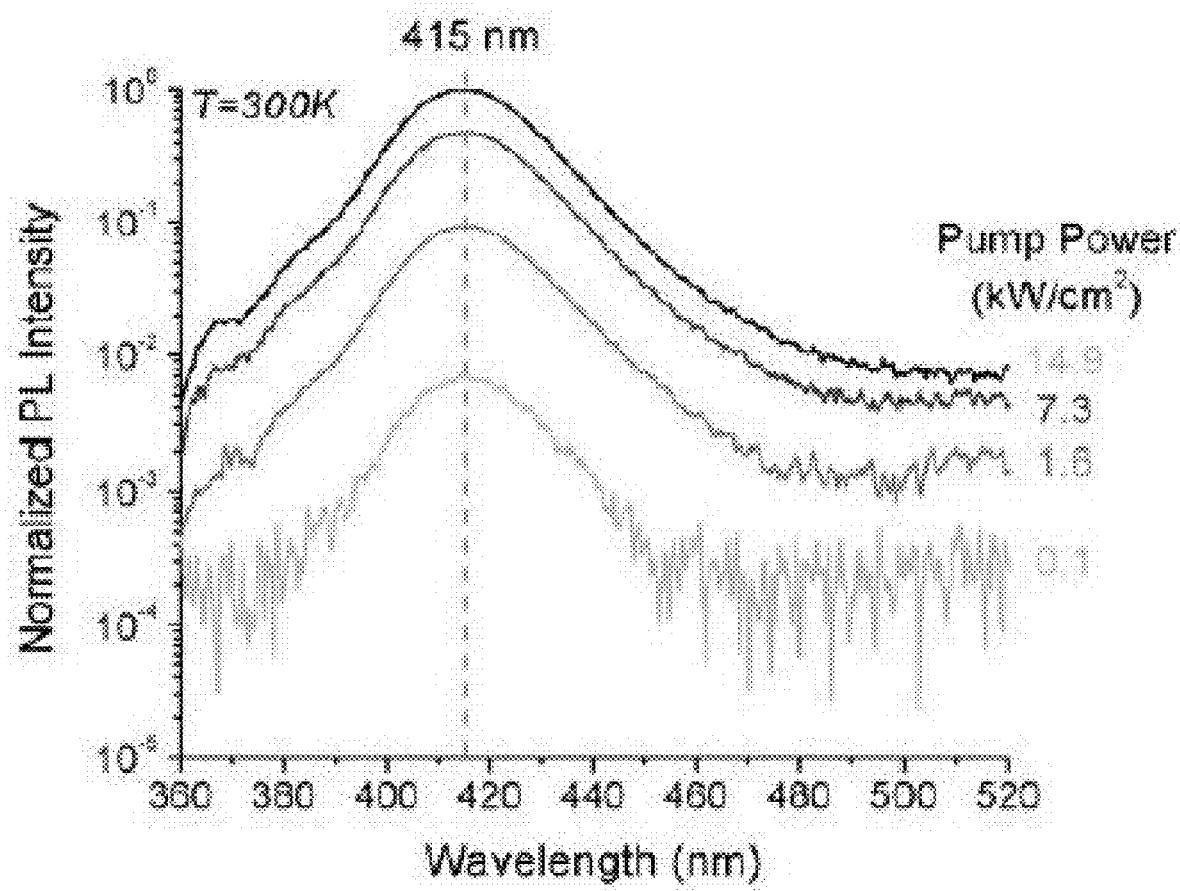
FIG. 3 illustrates the PL spectra of an a-plane $In_{0.03}Ga_{0.97}$N/$In_{0.1}Ga_{0.9}$N MQW structure with a nominal well width of 5.0 nm measured for various pump powers.

Further, FIG. 3 illustrates the PL spectra of an a-plane $In_{0.03}Ga_{0.97}N/In_{0.1}Ga_{0.9}N$ MQW structure with a nominal well width of 5.0 nm measured for various pump powers. PL intensity increases with pump power as expected while the peak emission wavelength is pump power independent, indicating that the band profiles are not influenced by polarization-induced electric fields.

In addition to (In,Ga)N quantum wells, heterostructures containing (Al,Ga)N/GaN superlattices may also be grown on the non-polar (11$\bar{2}$0) a-plane GaN layers. For example, heterostructures typically consist of two layers, most commonly (AlGa)N on GaN, to produce an electrical channel necessary for transistor operation. The thickness and composition of the superlattice layers may comprise, but are not limited to:

9 nm $Al_{0.4}GaN$ barrier
11 nm GaN well

In one example, Block 110 was repeated 10 times to form a 10-period $Al_{0.4}Ga_{0.6}N/GaN$ superlattice that was terminated with a 11 nm GaN well layer. The superlattice was grown via MOCVD at conditions similar to those employed for the underlying template layer: ~1100° C. growth temperature, ~0.1 atm growth pressure, 38 μmol/min Al flow, 20 μmol/min Ga flow, and 40,000 μmol/min N flow. The Al flow was simply turned off to form the GaN well layers. Successful growth conditions are not strictly defined by the values presented above. Similar to the (In,Ga)N quantum wells, the luminescence characteristics of the superlattice described above indicate that polarization fields do not affect the structure.

Figure 4:
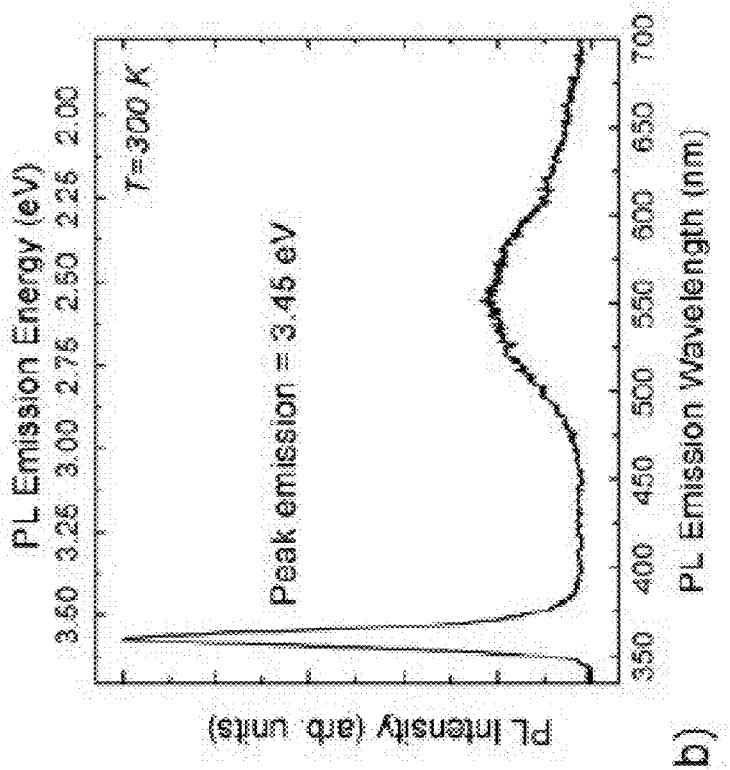
FIG. 4(a) shows a 2θ-ω x-ray diffraction scan of the 10-period $Al_{0.4}Ga_{0.6}N/GaN$ superlattice, which reveals clearly defined satellite peaks.
FIG. 4(b) illustrates the PL spectra of the superlattice characterized in FIG. 4(a)
Figure 4:
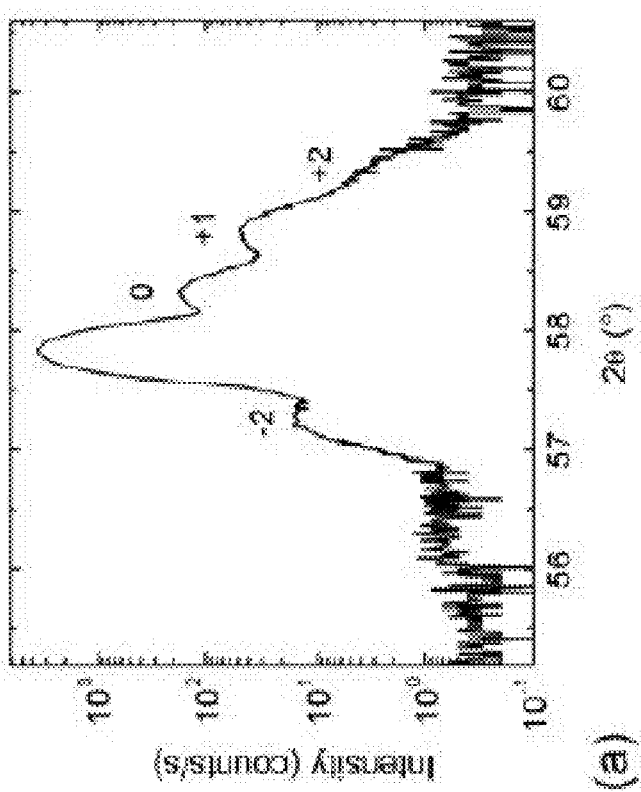

FIG. 4(a) shows a 2θ-ω x-ray diffraction scan of the 10-period $Al_{0.4}Ga_{0.6}N/GaN$ superlattice, which reveals clearly defined satellite peaks, while FIG. 4(b) illustrates the PL spectra of the superlattice characterized in FIG. 4(a). The absence of polarization-induced fields was evidenced by the 3.45 eV (~360 nm) band edge emission of the superlattice. The band edge emission did not experience the subtle redshift present in c-plane superlattices.

Experimental Results for as-Grown GaN

The crystallographic orientation and structural quality of the as-grown GaN films and r-plane sapphire were determined using a Philips™ four-circle, high-resolution, x-ray diffractometer (HR-XRD) operating in receiving slit mode with four bounce Ge(220)-monochromated Cu Kα radiation and a 1.2 mm slit on the detector arm. Convergent beam electron diffraction (CBED) was used to determine the polarity of the a-GaN films with respect to the sapphire substrate. Plan-view and cross-section transmission electron microscopy (TEM) samples, prepared by wedge polishing and ion milling, were analyzed to define the defect structure of a-GaN. A Digital Instruments D3000 Atomic Force Microscope (AFM) in tapping mode produced images of the surface morphology.

Figure 5:
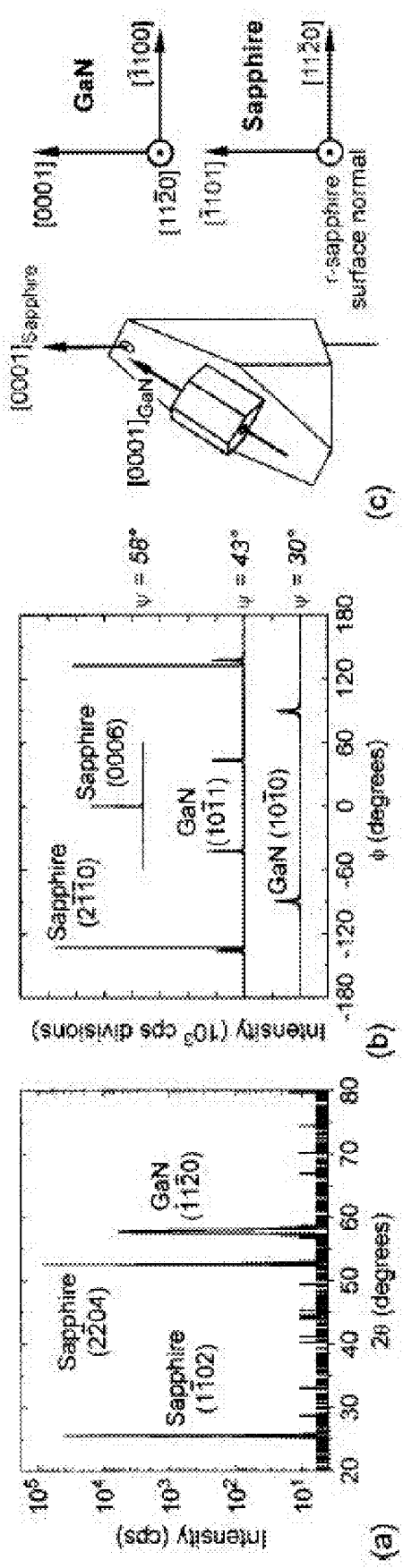
FIG. 5(a) shows a 2θ-ω diffraction scan that identifies the growth direction of the GaN film as (11$\bar{2}$0) a-plane GaN.
FIG. 5(b) is a compilation of off-axis φ scans used to determine the in-plane epitaxial relationship between GaN and r-sapphire, wherein the angle of inclination ψ used to access the off-axis reflections is noted for each scan.
FIG. 5(c) is a schematic illustration of the epitaxial relationship between the GaN and r-plane sapphire.

FIG. 5(a) shows a 2θ-ω diffraction scan that identifies the growth direction of the GaN film as (11$\bar{2}$0) a-plane GaN. The scan detected sapphire (1$\bar{1}$02), (2$\bar{2}$04), and GaN (11$\bar{2}$0) reflections. Within the sensitivity of these measurements, no GaN (0002) reflections corresponding to 2θ=34.604° were detected, indicating that there is no c-plane (0002) content present in these films, and thus instabilities in the GaN growth orientation are not a concern.

FIG. 5(b) is a compilation of off-axis ϕ scans used to determine the in-plane epitaxial relationship between GaN and r-sapphire, wherein the angle of inclination ψ used to access the off-axis reflections is noted for each scan. Having confirmed the a-plane growth surface, off-axis diffraction peaks were used to determine the in-epitaxial relationship between the GaN and the r-sapphire. Two sample rotations ϕ and ψ were adjusted in order to bring off-axis reflections into the scattering plane of the diffractometer, wherein ϕ is the angle of rotation about the sample surface normal and ψ is the angle of sample tilt about the axis formed by the intersection of the Bragg and scattering planes. After tilting the sample to the correct ψ for a particular off-axis reflection, ϕ scans detected GaN (10$\bar{1}$0), (10$\bar{1}$1), and sapphire (0006) peaks, as shown in FIG. 2(b). The correlation between the ϕ positions of these peaks determined the following epitaxial relationship: $[0001]_{GaN}\|[\bar{1}101]_{sapphire}$ and $[\bar{1}100]_{GaN}\|[11\bar{2}0]_{sapphire}$.

FIG. 5(c) is a schematic illustration of the epitaxial relationship between the GaN and r-plane sapphire. To complement the x-ray analysis of the crystallographic orientation, the a-GaN polarity was determined using CBED. The polarity's sign is defined by the direction of the polar Ga—N bonds aligned along the GaN c-axis; the positive c-axis [0001] points from a gallium atom to a nitrogen atom. Consequently, a gallium-face c-GaN film has a [0001] growth direction, while a nitrogen-face c-GaN crystal has a [000$\bar{1}$] growth direction. For a-GaN grown on r-sapphire, $[0001]_{GaN}$ is aligned with the sapphire c-axis projection $[\bar{1}101]_{sapphire}$, and therefore, the epitaxial relationships defined above are accurate in terms of polarity. Consequently, the positive GaN c-axis points in same direction as the sapphire c-axis projection on the growth surface (as determined via CBED). This relationship concurs with the epitaxial relationships previously reported by groups using a variety of growth techniques. See References 17, 18 and 19. Therefore, the epitaxial relationship is specifically defined for the growth of GaN on an r-plane sapphire substrate.

Figure 6:
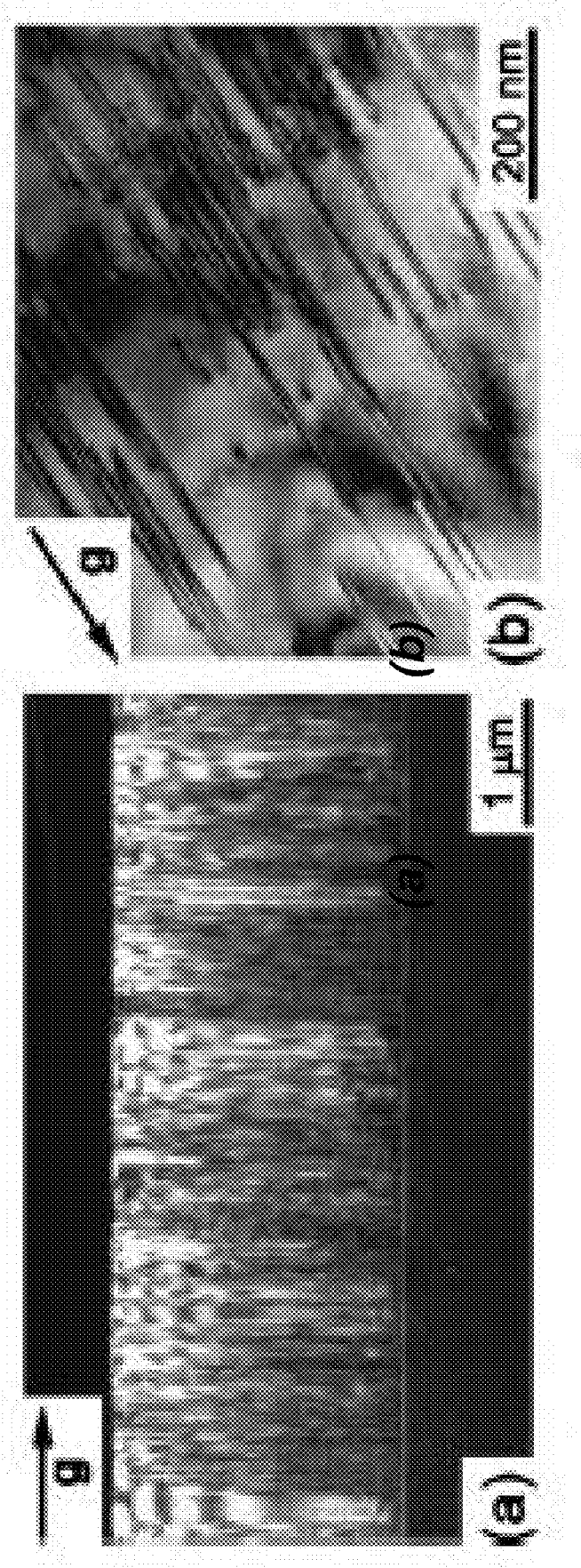
FIGS. 6(a) and 6(b) are cross-sectional and plan-view transmission electron microscopy (TEM) images, respectively, of the defect structure of the a-plane GaN films on r-plane sapphire.

FIGS. 6(a) and 6(b) are cross-sectional and plan-view TEM images, respectively, of the defect structure of the a-plane GaN films on an r-plane sapphire substrate. These images reveal the presence of line and planar defects, respectively. The diffraction conditions for FIGS. 3(a) and 3(b) are g=0002 and g=10$\bar{1}$0, respectively.

The cross-sectional TEM image in FIG. 6(a) reveals a large density of threading dislocations (TD's) originating at the sapphire/GaN interface with line directions parallel to the growth direction [11$\bar{2}$0]. The TD density, determined by plan view TEM, was $2.6 \times 10^{10}$ cm$^{-2}$. With the TD line direction parallel to the growth direction, pure screw dislocations will have Burgers vectors aligned along the growth direction b=± [11$\bar{2}$0]) while pure edge dislocations will have b=±[0001]. The reduced symmetry of the a-GaN surface with respect to c-GaN complicates the characterization of mixed dislocations since the crystallographically equivalent [11$\bar{2}$0] directions cannot be treated as the family <11$\bar{2}$0>. Specifically, the possible Burgers vectors of mixed dislocations can be divided into three subdivisions: (1) b=±[1$\bar{2}$10] b= and (3) b=±[$\bar{2}$110], (2) b=±[11$\bar{2}$0]±[0001], and (3) b =±[11$\bar{2}$0]±[1$\bar{2}$10] and b=±[11$\bar{2}$0]±[$\bar{2}$110].

In addition to line defects, the plan view TEM image in FIG. 6(b) reveals the planar defects observed in the a-GaN films. Stacking faults aligned perpendicular to the c-axis with a density of $3.8 \times 10^5$ cm$^{-1}$ were observed in the plan-view TEM images. The stacking faults, commonly associated with epitaxial growth of close-packed planes, most likely originate on the c-plane sidewalls of three-dimensional (3D) islands that form during the initial stages of the high temperature growth. Consequently, the stacking faults are currently assumed to be intrinsic and terminated by Shockley partial dislocations of opposite sign. Stacking faults with similar characteristics were observed in a-plane AlN films grown on r-plane sapphire substrates. See Reference 20. The stacking faults have a common faulting plane parallel to the close-packed (0001) and a density of $\sim 3.8 \times 10^5$ cm$^{-1}$.

Omega rocking curves were measured for both the GaN on-axis (11$\bar{2}$0) and off-axis (10$\bar{1}$1) reflections to characterize the a-plane GaN crystal quality. The full-width half-maximum (FWHM) of the on-axis peak was 0.29° (1037"), while the off-axis peak exhibited a larger orientational spread with a FWHM of 0.46° (1659"). The large FWHM values are expected since the microstructure contains a substantial dislocation density. According to the analysis presented by Heying et al. for c-GaN films on c-sapphire, on-axis peak widths are broadened by screw and mixed dislocations, while off-axis widths are broadened by edge-component TD's (assuming the TD line is parallel to the film normal). See Reference 21. A relatively large edge dislocation density is expected for a-GaN on r-sapphire due to the broadening of the off-axis peak compared to the on-axis peak. Additional microstructural analyses are required to correlate a-GaN TD geometry to rocking curve measurements.

Figure 7:
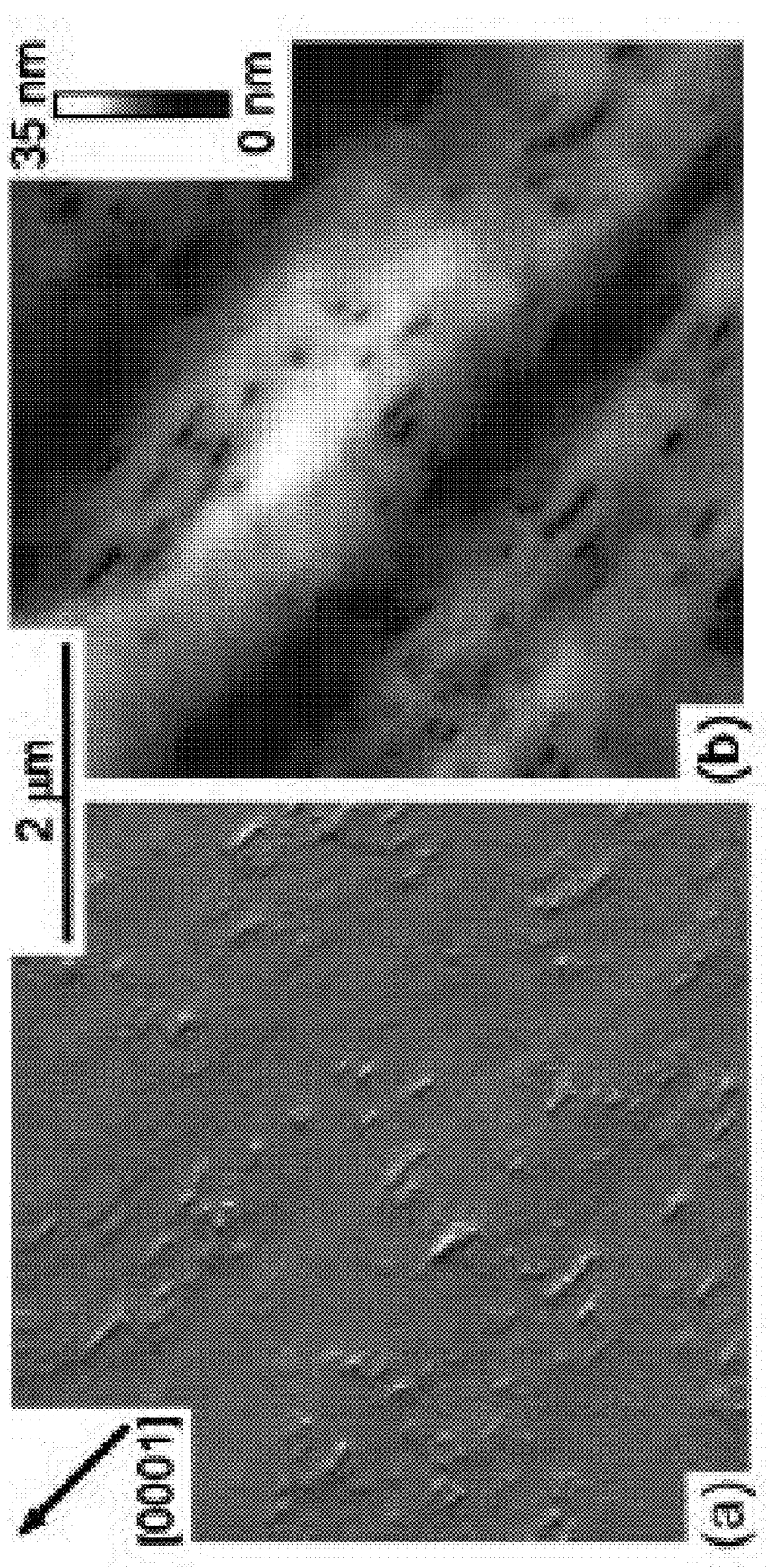
FIGS. 7(a) and 7(b) are atomic force microscopy (AFM) amplitude and height images, respectively, of the surface of the as-grown a-plane GaN films.

FIGS. 7(a) and 7(b) are AFM amplitude and height images, respectively, of the surface of the as-grown a-plane GaN film. The surface pits in the AFM amplitude image of FIG. 7(a) are uniformly aligned parallel to the GaN c-axis, while the terraces visible in the AFM height image of FIG. 7(b) are aligned perpendicular to the c-axis.

Although optically specular with a surface RMS roughness of 2.6 nm, the a-GaN growth surface is pitted on a sub-micron scale, as can be clearly observed in the AFM amplitude image shown in FIG. 7(a). It has been proposed that the surface pits are decorating dislocation terminations with the surface; the dislocation density determined by plan view TEM correlates with the surface pit density within an order of magnitude.

In addition to small surface pits aligned along GaN c-axis [0001], the AFM height image in FIG. 7(b) reveals faint terraces perpendicular to the c-axis. Although the seams are not clearly defined atomic steps, these crystallographic features could be the early signs of the surface growth mode. At this early point in the development of the a-plane growth process, neither the pits nor the terraces have been correlated to particular defect structures.

References

The following references are incorporated by reference herein:

1. T. Takeuchi, S. Sota, M. Katsuragawa, M. Komori, H. Takeuchi, H. Amano, and I. Akasaki, Japanese Journal of Applied Physics, Part 2 (Letters) 36, L382-5 (1997).

2. P. Lefebvre, A. Morel, M. Gallart, T. Taliercio, J. Allegre, B. Gil, H. Mathieu, B. Damilano, N. Grandjean, and J. Massies, Applied Physics Letters 78, 1252-4 (2001).

3. N. Grandjean, B. Damilano, S. Dalmasso, M. Leroux, M. Laugt, and J. Massies, J. Appl. Phys. 86 (1999) 3714.

4. M. Leroux, N. Grandjean, J. Massies, B. Gil, P. Lefebvre, and P. Bigenwald, Phys. Rev. B 60 (1999) 1496.

5. R. Langer, J. Simon, V. Ortiz, N. T. Pelekanos, A. Barski, R. Andre, and M. Godlewski, Appl. Phys. Lett. 74 (1999) 3827.

6. P. Lefebvre, J. Allegre, B. Gil, H. Mathieu, N. Grandjean, M. Leroux, J. Massies, and P. Bigenwald, Phys. Rev. B 59 (1999) 15363.

7. I. Jin Seo, H. Kollmer, J. Off, A. Sohmer, F. Scholz, and A. Hangleiter, Phys. Rev. B 57 (1998) R9435.

8. P. Seoung-Hwan and C. Shun-Lien, Appl. Phys. Lett. 76 (2000) 1981.

9. P. Waltereit, O. Brandt, A. Trampert, H. T. Grahn, J. Menniger, M. Ramsteiner, M. Reiche, and K. H. Ploog, Nature 406 (2000) 865.

10. H. M. Ng, Appl. Phys. Lett. 80 (2002) 4369.

11. M. D. Craven, S. H. Lim, F. Wu, J. S. Speck, and S. P. DenBaars, Appl. Phys. Lett. 81 (2002) 469.

12. O. Brandt, P. Waltereit, and K. H. Ploog, J. Phys. D, Appl. Phys. (UK) 35 (2002) 577.

13. M. Leszczynski, H. Teisseyre, T. Suski, I. Grzegory, M. Bockowski, J. Jun, S. Porowski, K. Pakula, J. M. Baranowski, C. T. Foxon, and T. S. Cheng, Appl. Phys. Lett. 69 (1996) 73.

14. A. F. Wright, J. Appl. Phys. 82 (1997) 2833.

15. I. H. Tan, G. L. Snider, L. D. Chang, and E. L. Hu, J. Appl. Phys. 68 (1990) 4071.

16. E. Yablonovitch and E. O. Kane, Journal of Lightwave Technology LT-4(5), 504-6 (1986).

17. T. Sasaki and S. Zembutsu, J. Appl. Phys. 61, 2533 (1987).

18. T. Lei, K. F. Ludwig, Jr., and T. D. Moustakas, J. Appl. Phys. 74, 4430 (1993).

19. T. D. Moustakas, T. Lei, and R. J. Molnar, Physica B 185, 36 (1993).

20. K. Dovidenko, S. Oktyabrsky, and J. Narayan, J. Appl. Phys. 82, 4296 (1997).

21. B. Heying, X. H. Wu, A. S. Keller, Y. Li, D. Kapolnek, B. P. Keller, S. P. DenBaars, and J. S. Speck, Appl. Phys. Lett. 68, 643 (1996).

Conclusion

This concludes the description of the preferred embodiment of the present invention. The following describes some alternative embodiments for accomplishing the present invention.

For example, variations in non-polar (Al,In,Ga)N quantum wells and heterostructures design and MOCVD growth conditions may be used in alternative embodiments. Moreover, the specific thickness and composition of the layers, in addition to the number of quantum wells grown, are variables inherent to quantum well structure design and may be used in alternative embodiments of the present invention.

Further, the specific MOCVD growth conditions determine the dimensions and compositions of the quantum well structure layers. In this regard, MOCVD growth conditions are reactor dependent and may vary between specific reactor designs. Many variations of this process are possible with the variety of reactor designs currently being using in industry and academia.

Variations in conditions such as growth temperature, growth pressure, V/III ratio, precursor flows, and source materials are possible without departing from the scope of the present invention. Control of interface quality is another important aspect of the process and is directly related to the flow switching capabilities of particular reactor designs. Continued optimization of the growth conditions will result in more accurate compositional and thickness control of the integrated quantum well layers described above.

In addition, a number of different growth methods other than MOCVD could be used in the present invention. For example, the growth method could also be molecular beam epitaxy (MBE), liquid phase epitaxy (LPE), hydride vapor phase epitaxy (HVPE), sublimation, or plasma-enhanced chemical vapor deposition (PECVD).

Further, although non-polar a-plan GaN thin films are described herein, the same techniques are applicable to non-polar m-plane GaN thin films. Moreover, non-polar InN, AlN, and AlInGaN thin films could be created instead of GaN thin films.

Finally, substrates other than sapphire substrate could be employed for non-polar GaN growth. These substrates include silicon carbide, gallium nitride, silicon, zinc oxide, boron nitride, lithium aluminate, lithium niobate, germanium, aluminum nitride, and lithium gallate.

In summary, the present invention describes a method for forming non-polar (Al,B,In,Ga)N quantum well and heterostructure materials and devices. First, non-polar (11$\bar{2}$0) a-plane GaN thin film layers are grown on a (1$\bar{1}$02) r-plane sapphire substrate using MOCVD. These non-polar (11$\bar{2}$0) a-plane GaN layers comprise templates for producing non-polar (Al,B,In,Ga)N quantum well and heterostructure materials and devices.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A nitride semiconductor device, comprising one or more non-polar (Al, B, In, Ga)N quantum well layers containing Indium, wherein at least one of the (Al, B, In, Ga)N quantum well layers has a thickness greater than 5 nanometers and emits light having a peak photoluminescence (PL) emission wavelength and an intensity that are greater than a PL emission wavelength and an intensity of light emitted from a non-polar (Al, B, In, Ga)N quantum well layer having a thickness of 5 nanometers or less.

2. The device of claim 1, wherein at least one of the (Al, B, In, Ga)N quantum well layers is an InGaN quantum well layer.

3. The device of claim 1, wherein the device is a light emitting diode or laser diode and an active layer of the light emitting diode or the laser diode includes the one or more non-polar (Al, B, In, Ga)N quantum well layers.

4. The device of claim 1, wherein the device includes a heterostructure formed from the one or more non-polar (Al, B, In, Ga)N quantum well layers.

5. The device of claim 1, wherein the one or more non-polar (Al, B, In, Ga)N quantum well layers are non-polar a-plane layers.

6. The device of claim 1, wherein the one or more non-polar (Al, B, In, Ga)N quantum well layers are non-polar m-plane layers.

7. A nitride semiconductor device, comprising one or more non-polar (Al, B, In, Ga)N layers grown on a non-polar GaN substrate wherein the non-polar (Al, B, In, Ga)N layers include one or more non-polar (Al, B, In, Ga)N quantum wells that has a thickness greater than 5 nanometers and emits light having a peak photoluminescence (PL) emission wavelength and an intensity that are greater than a PL emission wavelength and an intensity of light emitted from a non-polar (Al, B, In, Ga)N quantum well having a thickness of 5 nanometers or less.

8. The device of claim 7, wherein at least one of the quantum wells is an indium containing quantum well layer.

9. The device of claim 8, wherein at least one of the quantum wells is an InGaN quantum well.

10. The device of claim 7, wherein the non-polar (Al, B, In, Ga)N layers include a heterostructure.

11. The device of claim 7, wherein the device is a light emitting diode or laser diode and an active layer of the light emitting diode or the laser diode includes a heterostructure or quantum well formed from the one or more non-polar (Al, B, In, Ga)N layers.

12. The device of claim 7, wherein the device includes a heterostructure formed from the one or more non-polar (Al, B, In, Ga)N layers.

13. The device of claim 7, wherein the one or more non-polar (Al, B, In, Ga)N layers are non-polar a-plane layers grown on an a-plane surface of the non-polar GaN substrate.

14. The device of claim 7, wherein the one or more non-polar (Al, B, In, Ga)N layers are non-polar m-plane layers grown on an m-plane surface of the non-polar GaN substrate.

15. The device of claim 7, wherein the non-polar GaN substrate has a threading dislocation density of no more than $2.6 \times 10^{10}$ cm$^{-2}$.

16. The device of claim 7, wherein the non-polar GaN substrate has a stacking fault density of no more than $3.8 \times 10^{5}$ cm$^{-1}$.

17. The device of claim 7, wherein the one or more non-polar (Al, B, In, Ga)N layers are grown on a grown non-polar surface of the non-polar GaN substrate.

18. A method for fabricating a nitride semiconductor device, comprising:

growing one or more non-polar (Al, B, In, Ga)N quantum well layers containing Indium, wherein at least one of the (Al, B, In, Ga)N quantum well layers has a thickness greater than 5 nanometers and emits light having a peak photoluminescence (PL) emission wavelength and an intensity that are greater than a PL emission wavelength and an intensity of light emitted from a non-polar (Al, B, In, Ga)N quantum well layer having a thickness of 5 nanometers or less.

19. The method of claim 18, wherein the growing is by metal organic chemical vapor deposition (MOCVD).

20. The method of claim 18, wherein the non-polar (Al, B, In, Ga)N quantum well layers are grown on or above a non-polar GaN substrate.

21. The method of claim 18, further comprising obtaining a grown non-polar surface of GaN substrate, and growing the quantum well layers on or above the grown non-polar surface.

* * * * *